(12) United States Patent
Claiborne (10) Patent No.: US 7,249,558 B2
(45) Date of Patent: Jul. 31, 2007

(54) SOLDER PASTE DISPENSER FOR A STENCIL PRINTER

(75) Inventor: William Russell Claiborne, Worcester, MA (US)

(73) Assignee: Speedline Technologies, Inc., Franklin, MA (US)

( * ) Notice: Subject to any disclaimer, the term of this patent is extended or adjusted under 35 U.S.C. 154(b) by 10 days.

(21) Appl. No.: 10/891,625

(22) Filed: Jul. 15, 2004

(65) Prior Publication Data

US 2006/0011075 A1    Jan. 19, 2006

(51) Int. Cl.
*B41L 27/00*    (2006.01)
(52) U.S. Cl. .................................. 101/123; 101/129
(58) Field of Classification Search ................ 101/114, 101/119, 120, 123, 124, 126, 129; 118/213, 118/301
See application file for complete search history.

(56) References Cited

U.S. PATENT DOCUMENTS

| | | | |
|---|---|---|---|
| 5,709,905 A | | 1/1998 | Shaw |
| 5,947,022 A | | 9/1999 | Freeman et al. |
| 5,988,060 A | | 11/1999 | Asai et al. |
| 6,041,702 A | * | 3/2000 | Ichikawa et al. ............ 101/35 |
| 6,423,141 B1 | | 7/2002 | Lin et al. |
| 6,571,701 B1 | | 6/2003 | Pham-Van-Diep et al. |
| 6,626,097 B2 | | 9/2003 | Rossmeisl et al. |
| 6,715,415 B2 | * | 4/2004 | Yamasaki et al. ........... 101/123 |
| 2002/0148369 A1 | | 10/2002 | Yamasaki et al. |
| 2002/0166505 A1 | | 11/2002 | Hikami et al. |
| 2003/0084797 A1 | * | 5/2003 | Abe et al. ................... 101/123 |
| 2004/0187716 A1 | * | 9/2004 | Pham-Van-Diep et al. .. 101/123 |

OTHER PUBLICATIONS

International Search Report for PCT/US2005/025071 mailed Nov. 11, 2005.

* cited by examiner

*Primary Examiner*—Ren Yan
(74) *Attorney, Agent, or Firm*—Lowrie, Lando & Anastasi, LLP (57) ABSTRACT

A stencil printer for printing solder paste onto a substrate includes a frame, a stencil, coupled to the frame, having apertures formed therein, a support assembly, coupled to the frame, to support the substrate in a printing position beneath the stencil, and a dispensing head coupled to the frame in such a manner that the dispensing head is configured to traverse the stencil during first and second print strokes. The dispensing head includes a frame assembly and a wiper blade assembly, coupled to the frame assembly, having first and second wiper blades that contact the stencil to print solder paste onto the stencil during a print stroke. The first and second wiper blades are constructed and arranged to force solder paste through the apertures of the stencil. The dispensing head further includes a dispensing unit, coupled to the frame assembly, having a chamber adapted to dispense solder paste, the dispensing unit being disposed between the first and second wiper blades to deposit solder paste therebetween. A method for printing solder paste on a substrate is further disclosed.

15 Claims, 6 Drawing Sheets

SOLDER PASTE DISPENSER FOR A STENCIL PRINTER

FIELD OF THE INVENTION

The present invention relates to apparatuses and processes for dispensing material, and more particularly to an apparatus and process for dispensing solder paste in a screen or stencil printer.

BACKGROUND OF THE INVENTION

In typical surface-mount circuit board manufacturing operations, a stencil printer is used to print solder paste onto a circuit board. Typically, a circuit board having a pattern of pads or some other conductive surface onto which solder paste will be deposited is automatically fed into the stencil printer and one or more small holes or marks on the circuit board, called fiducials, is used to properly align the circuit board with a stencil or screen of the printer prior to the printing of solder paste onto the circuit board. After the circuit board is aligned, the board is raised to the stencil, solder paste is dispensed onto the stencil, and a wiper blade (or squeegee) traverses the stencil to force the solder paste through apertures formed in the stencil and onto the board.

In some prior art stencil printers, a dispensing head delivers solder paste between first and second wiper blades, wherein the one of the wiper blades is used to move or roll solder paste across the stencil in a direction opposite to the direction of the other wiper blade. The first and second wiper blades are used on alternating boards to continually pass the roll of solder paste over the apertures of a stencil to print each successive circuit board. The wiper blades are typically at a predetermined angle with the stencil to apply downward pressure on the solder paste to force the solder paste through the apertures of the stencil.

Figure 1:
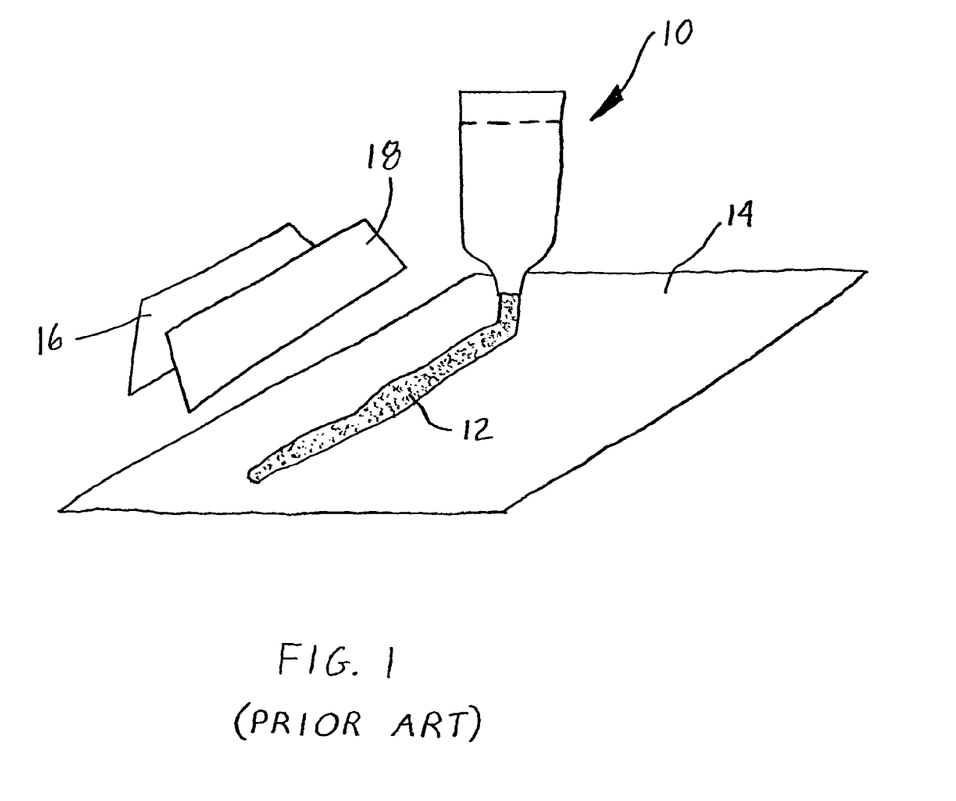
FIG. 1 is a perspective schematic representation of a prior art dispensing system of a stencil printer.
Figure 2:
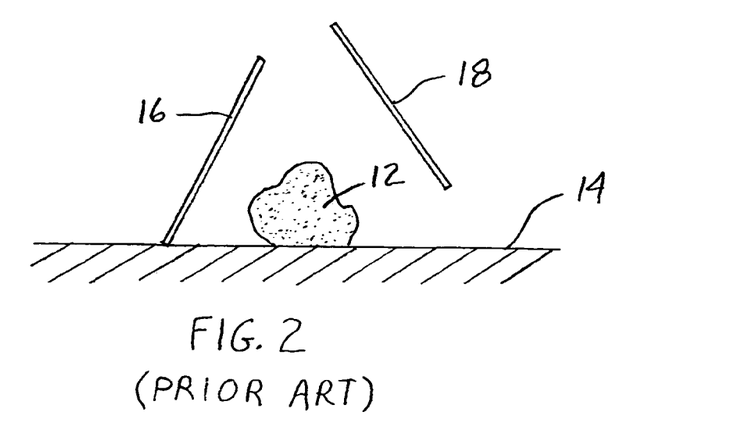
FIGS. 2-4 are side schematic views of the prior art dispensing system shown in FIG. 1 illustrating wiper blades of the dispensing system during printing operations.
Figure 3:
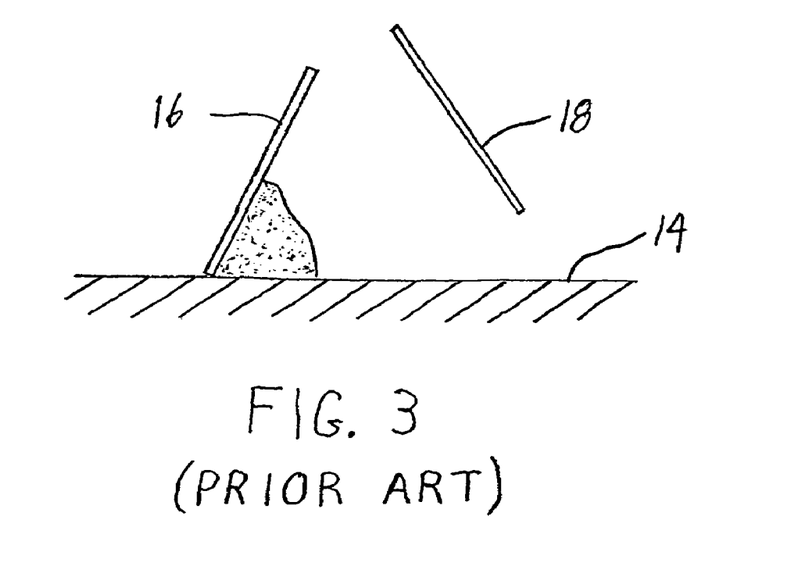
Figure 4:
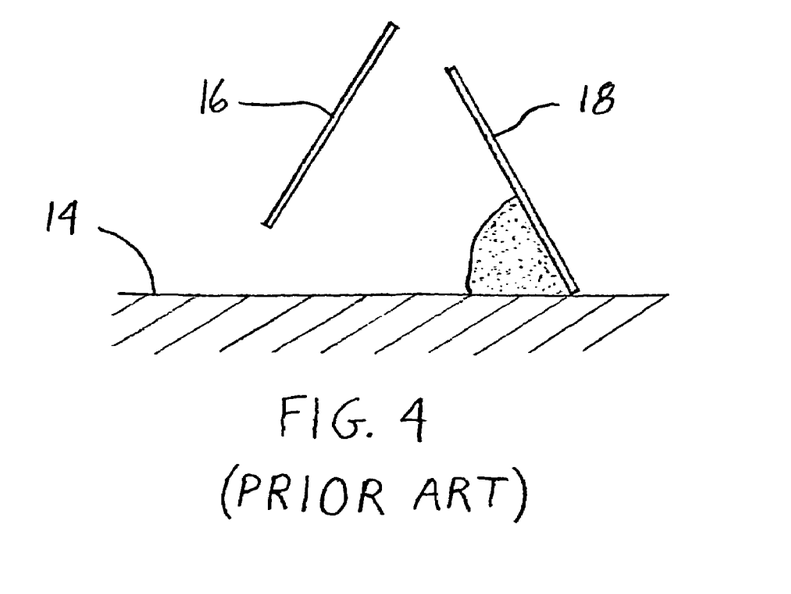

This type of dispensing system is illustrated in FIGS. 1-4. Specifically, a dispensing head 10 deposits a bead 12 of solder paste on a stencil 14. This step is illustrated in schematic form in FIG. 1. Next, wiper blades 16, 18 are positioned over the bead 12 of solder paste in such a manner that the leading blade 18 is lifted off of the stencil 14 and the trailing blade 16 engages the stencil (see FIG. 2). During a print stroke, the trailing blade 16 rolls the solder paste to force the solder paste into the apertures (not shown) of the stencil 14. The force applied by the wiper blade 16 forces the solder paste into the apertures provided in the stencil 14. Upon completing the print stroke, the leading blade 18 shown in FIGS. 2 and 3 is lowered to engage the stencil 14 and the trailing blade 16 (as shown in FIGS. 2 and 3) is lifted off of the stencil. With reference to FIG. 4, blade 16 becomes the leading blade and blade 18 becomes the trailing blade that rolls the solder paste across the stencil 14 during a subsequent print operation.

One disadvantage of the system disclosed in FIGS. 1-4 is that the wiper blades have to be manipulated, e.g., by lifting one blade so that solder paste can be dispensed between the wiper blades or by moving the entire wiper blade assembly as illustrated in FIG. 1, to replenish the solder paste.

Another approach to printing solder paste can be found in U.S. Pat. No. 5,947,022, issued on Sep. 7, 1999 to Freeman et al. In one system described in this patent, a dispensing head having two wiper blades is pressurized by applying air pressure to the solder paste being dispensed. Specifically, when the dispensing head is in a lowered printing position, solder paste is forced from the dispensing head onto the stencil using air pressure as the dispensing head is moved across the stencil. For each direction that the dispensing head moves across the stencil, one of the wiper blades will be a trailing blade and will scrape any excess solder paste off the stencil. In the system described in U.S. Pat. No. 5,947,022, pressure provided by the dispensing head, rather than its wiper blades, forces solder paste through the stencil. At the conclusion of printing, when it is a desired to lift the dispensing head off of the stencil, the pressurized air is turned off prior to lifting the dispensing head off of the stencil. It should be understood that the pressure of the solder paste is carefully maintained in a dispensing chamber of the dispensing head to achieve effective printing operations.

SUMMARY OF THE INVENTION

A first aspect of the present invention is directed to a stencil printer for printing solder paste onto a substrate. The stencil printer comprises a frame, a stencil, coupled to the frame, having apertures formed therein, a support assembly, coupled to the frame, to support the substrate in a printing position beneath the stencil, and a dispensing head coupled to the frame in such a manner that the dispensing head is configured to traverse the stencil during first and second print strokes. The dispensing head comprises a frame assembly and a wiper blade assembly, coupled to the frame assembly, having first and second wiper blades that contact the stencil to print solder paste onto the stencil during a print stroke. The first and second wiper blades are constructed and arranged to force solder paste through the apertures of the stencil. The dispensing head further comprises a dispensing unit, coupled to the frame assembly, having a chamber adapted to dispense solder paste, the dispensing unit being disposed between the first and second wiper blades to deposit solder paste therebetween.

The first wiper blade is adapted to print solder paste during the first print stroke and the second wiper blade is adapted to print solder paste during the second print stroke. The dispensing unit has a housing that defines the chamber. The dispensing head further comprises a removable cartridge constructed and arranged for containing solder paste, the cartridge having a removable nozzle coupled to the housing to dispense solder paste from the housing and an inlet to receive pressurized air to apply pressure to the solder paste to cause the solder paste to be dispensed.

The dispensing head further comprises a translational movement assembly, coupled to the frame assembly and the dispensing unit, to move the dispensing unit in a direction transverse to the direction of the movement of the dispensing head during the first and second print strokes. The translational movement assembly has a support bracket to support the dispensing unit, a rail member connected to the frame assembly, and a motor to move the dispensing unit along the rail member.

In a second aspect of the invention, a method for printing solder paste onto substrate comprises (a) delivering a substrate to a stencil printer, (b) positioning the substrate in a print position, (c) engaging a stencil having apertures to the substrate, (d) performing a print stroke with one of first and second wiper blades to force solder paste through the apertures of the stencil on to the substrate, and (e) depositing solder paste between the first and second wiper blades during the print stroke.

The method further comprises delivering a subsequent substrate to the stencil printer, positioning the subsequent substrate in a print position, and performing a subsequent print stroke with the other of the first and second wiper blades to print solder paste on the subsequent substrate. The step of depositing solder paste between the first and second wiper blades further includes depositing solder paste between the first and second wiper blades along a length of the first and second wiper blades.

In a third aspect of the present invention, a dispensing head for depositing solder paste on a stencil of a stencil printer comprises a frame assembly and a wiper blade assembly, coupled to the frame assembly, having first and second wiper blades that contact the stencil to print solder paste onto the stencil during a print stroke. The first and second wiper blades is constructed and arranged to force solder paste through the apertures of the stencil. A dispensing unit, coupled to the frame assembly, has a chamber adapted to dispense solder paste. The dispensing unit is disposed between the first and second wiper blades to deposit solder paste therebetween.

In a fourth aspect of the invention, a stencil printer for printing solder paste onto a substrate comprises a frame, a stencil, coupled to the frame, having apertures formed therein, a support assembly, coupled to the frame, to support the substrate in a printing position beneath the stencil, and a wiper blade assembly, coupled to the frame, having first and second wiper blades that contact the stencil to print solder paste onto the stencil during a print stroke. The first and second wiper blades are constructed and arranged to force solder paste through the apertures of the stencil. The stencil printer further comprises means for depositing solder paste between the first and second wiper blades at any time during the print stroke.

BRIEF DESCRIPTION OF THE DRAWINGS

In the drawings, like reference characters refer to the same or similar parts throughout the different views. The drawings are not necessarily to scale, emphasis instead being placed upon illustrating particular principles, discussed below.

DETAILED DESCRIPTION OF THE INVENTION

For purposes of illustration, embodiments of the present invention will now be described with reference to a stencil printer used to print solder paste onto a circuit board. One skilled in the art will appreciate that embodiments of the present invention are not limited to stencil printers that print solder paste onto circuit boards, but rather, may be used in other applications requiring dispensing of other viscous materials, such as glues, encapsulatents, underfills, and other suitable assembly materials. Thus, any reference to solder paste herein contemplates use of such other materials. Further, stencil printers in accordance with embodiments of the present invention are not limited to those that print solder paste on circuit boards, but rather, include those used for printing other materials on a variety of substrates. Also, the terms "screen" and "stencil" may be used interchangeably herein to describe a device in a printer that defines a pattern to be printed onto a substrate.

Figure 5:
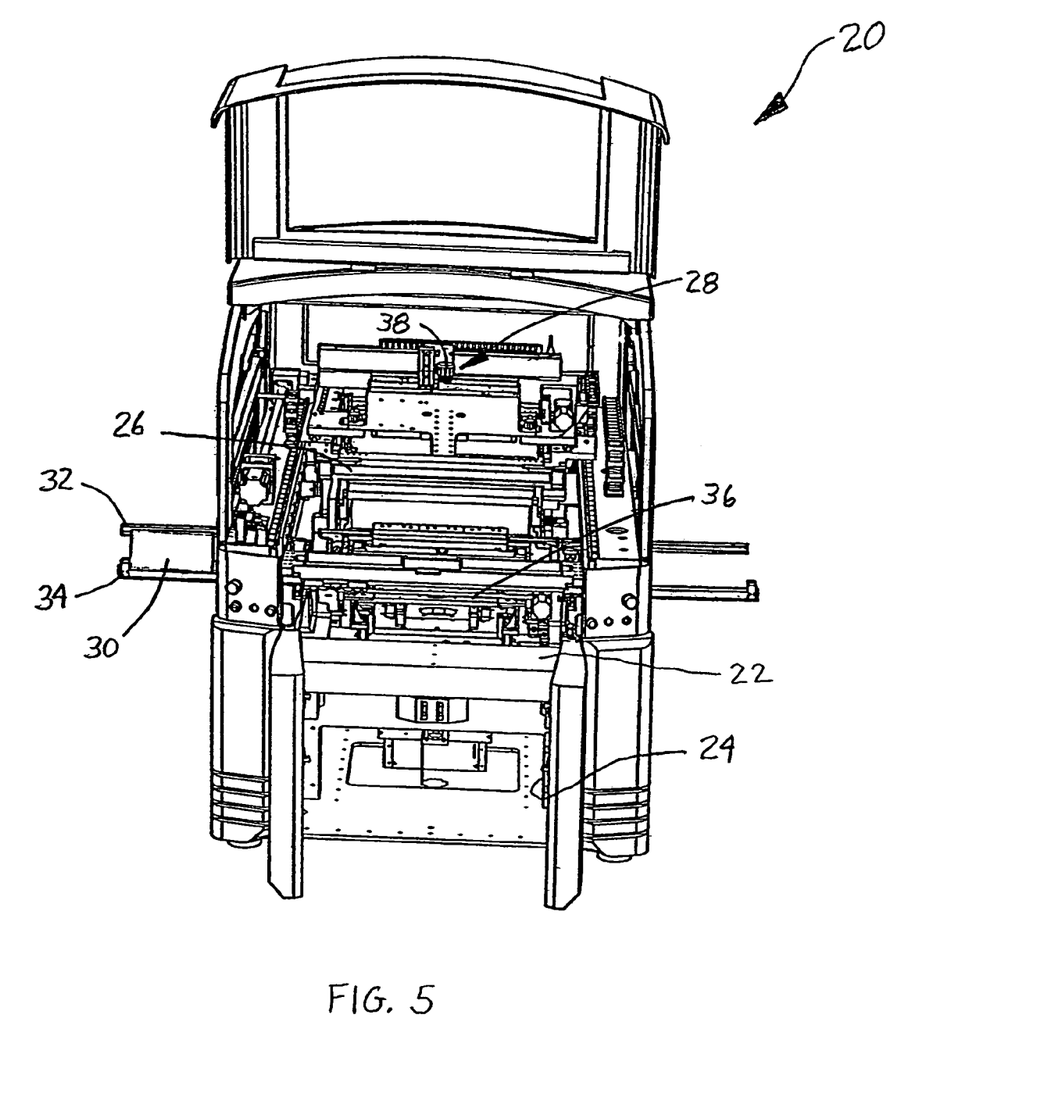
FIG. 5 is a front perspective view of a stencil printer in accordance with one embodiment of the present invention.

FIG. 5 shows a front perspective view of a stencil printer, generally indicated at 20, in accordance with one embodiment of the present invention. The stencil printer 20 includes a frame 22 that supports components of the stencil printer including a controller 24 located in the cabinet of the stencil printer, a stencil 26, and a dispensing head, generally indicated at 28, for dispensing solder paste. As will be discussed in greater detail below, the dispensing head 28 is movable along the x, y and z axes under the control of the controller 24 to allow printing of solder paste on a circuit board 30.

Stencil printer 20 also includes a conveyor system having rails 32, 34 for transporting the circuit board 30 to a printing position in the stencil printer 20. The stencil printer 20 has a support assembly 36 (e.g., pins, gel membranes, etc.) positioned beneath the circuit board 30 when the circuit board is in the dispensing position. The support assembly 36 is used to raise the circuit board 30 off of the rails 32, 34 to place the circuit board in contact with, or in close proximity to, the stencil 26 when printing is to occur.

The dispensing head 28, as will be discussed below, is configured to receive at least one solder paste cartridge 38 that provides solder paste to the dispensing head during a printing operation. In one embodiment, the solder paste cartridge 38 is coupled to one end of a pneumatic air hose in the well known manner. The other end of the pneumatic air hose is attached to a compressor contained within the frame 22 of the stencil printer 20 that under the control of the controller 24 provides pressurized air to the cartridge 38 to force solder paste into the dispensing head 28 and onto the stencil 26.

In another embodiment, mechanical devices, such as a piston, may be used in addition to, or in place of, air pressure to force the solder paste from the cartridge 38 into the dispensing head 28. In yet another embodiment, the controller 24 is implemented using a personal computer using a suitable operating system (e.g., Microsoft® DOS or Windows® NT) with application specific software to control the operation of the stencil printer as described herein.

The stencil printer 20 operates as follows. A circuit board 30 is loaded into the stencil printer 20 using the conveyor rails 32, 34. The dispensing head 28 is then lowered in the Z-direction until it is in contract with the stencil 26. The dispensing head 28 fully traverses the stencil 26 in a first print stroke to force solder paste through apertures of the stencil 26 and onto the circuit board 30. Once the dispensing head 28 has fully traversed the stencil 26, the circuit board 30 is lowered back onto the conveyor rails 32, 34 and transported from the printer 20 so that a second, subsequence circuit board may be loaded into the printer. To print on the second circuit board, the dispensing head 28 is moved in a second print stroke across the stencil 26 in an opposite direction to that used for the first circuit board 30. Further description of the operation and construction of the dispensing head 28 are provided below with reference to FIGS. 6-8.

Figure 6:
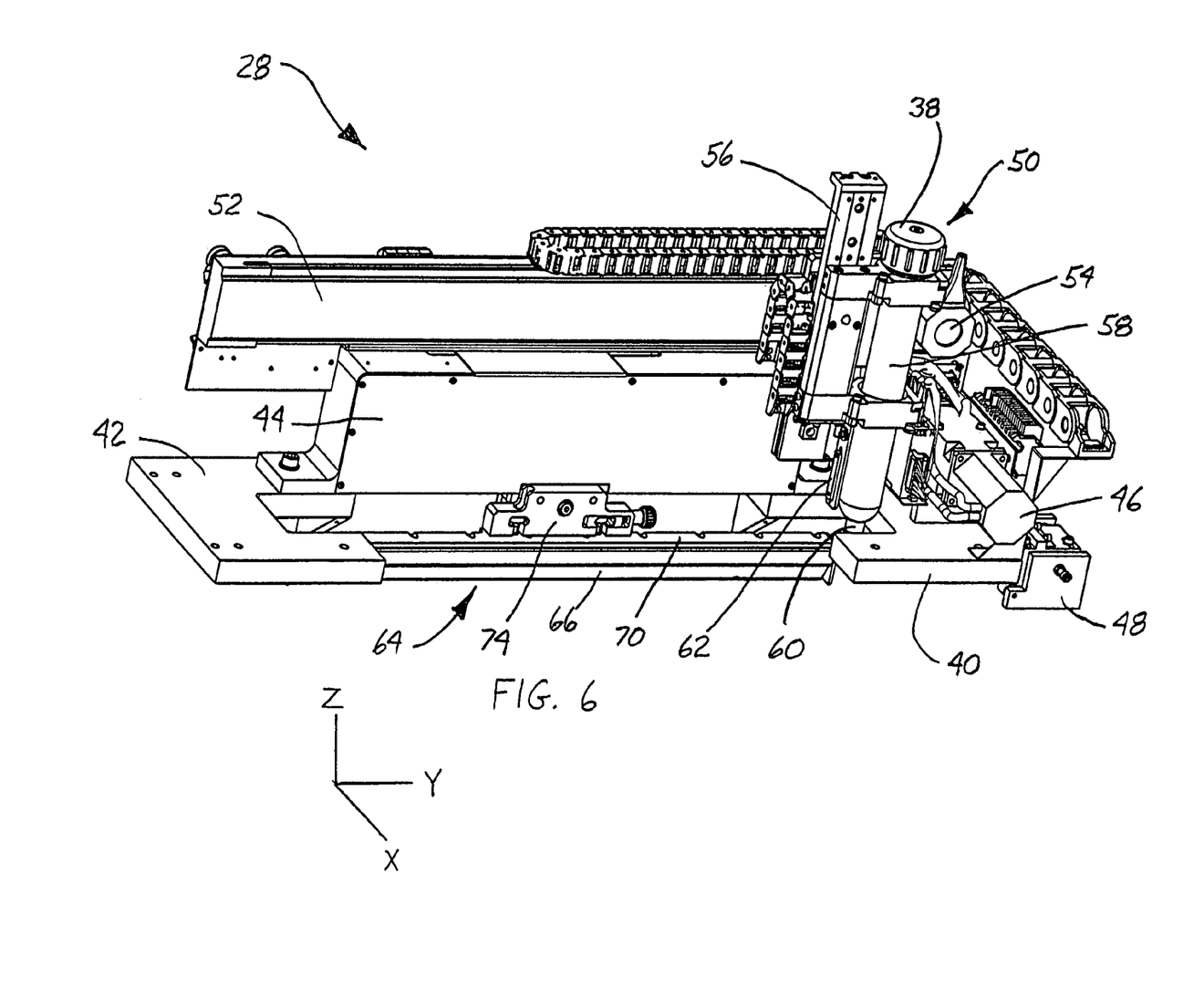
FIG. 6 is a perspective view of a dispensing head in accordance with at least one embodiment of the present invention.

FIG. 6 illustrates a dispensing head 28 in accordance with at least one embodiment of the present invention, which is capable of moving in three orthogonal axes X, Y and Z. As shown, the dispensing head 28 includes a dispensing head frame 40 suitably coupled to the frame 22 of the stencil printer 20. Specifically, the dispensing head frame 40 has a plate 42 that is slidably secured to the pair of rails 32, 34 provided on the frame 22 of the stencil printer 20 in the manner depicted in FIG. 5, and an upright support bracket 44 fastened to the plate. The plate 42 is adapted to rest on the rails 32, 34 of the stencil printer frame and a motor 46 is provided to move the dispensing head 28 for achieving the first and second print strokes over the stencil 26. Specifically, at least one mounting block 48 is provided for effecting the sliding movement of the dispensing head 28 along the rails 32, 34.

The dispensing head further includes a solder paste dispensing unit, generally indicated at 50, mounted on the support bracket 44, which in turn is mounted on a rail 52 formed or mounted on the support bracket. A motor 54 powers the movement of the dispensing unit 50 along the rail 52 to provide translational movement of the dispensing unit in a direction transverse to the direction of the first and second print strokes. The provision of the support bracket 44, rail 52 and the motor 54 is characterized herein as a translational movement assembly. The dispensing unit 50 is configured to move up and down in the Z-direction by means of a sliding mechanism 56 powered by a pneumatic actuator (not shown).

The solder paste dispensing unit 50 includes a cylindrical housing 58 that defines a cylindrical chamber. The housing 58 is adapted to receive the cylindrically-shaped cartridge 38 designed to contain solder paste. The cartridge is releasably secured to the housing in the well-known manner. In another aspect of the invention, solder paste can be manually deposited in the housing 58. As discussed above, the cartridge 38 is coupled to one end of a pneumatic air hose and the other end of the hose is attached to a compressor. The dispensing of solder paste from the cartridge and the housing is controlled by the controller 24 to dispense solder paste on the stencil 26. Specifically, solder paste is dispensed through a port or nozzle 60 provided at the lower end of the housing 58. A sensor 62 is removably secured to the housing 58 of the dispensing unit 50 for detecting whether the cartridge 38 is depleted or substantially depleted of solder paste.

Figure 8:
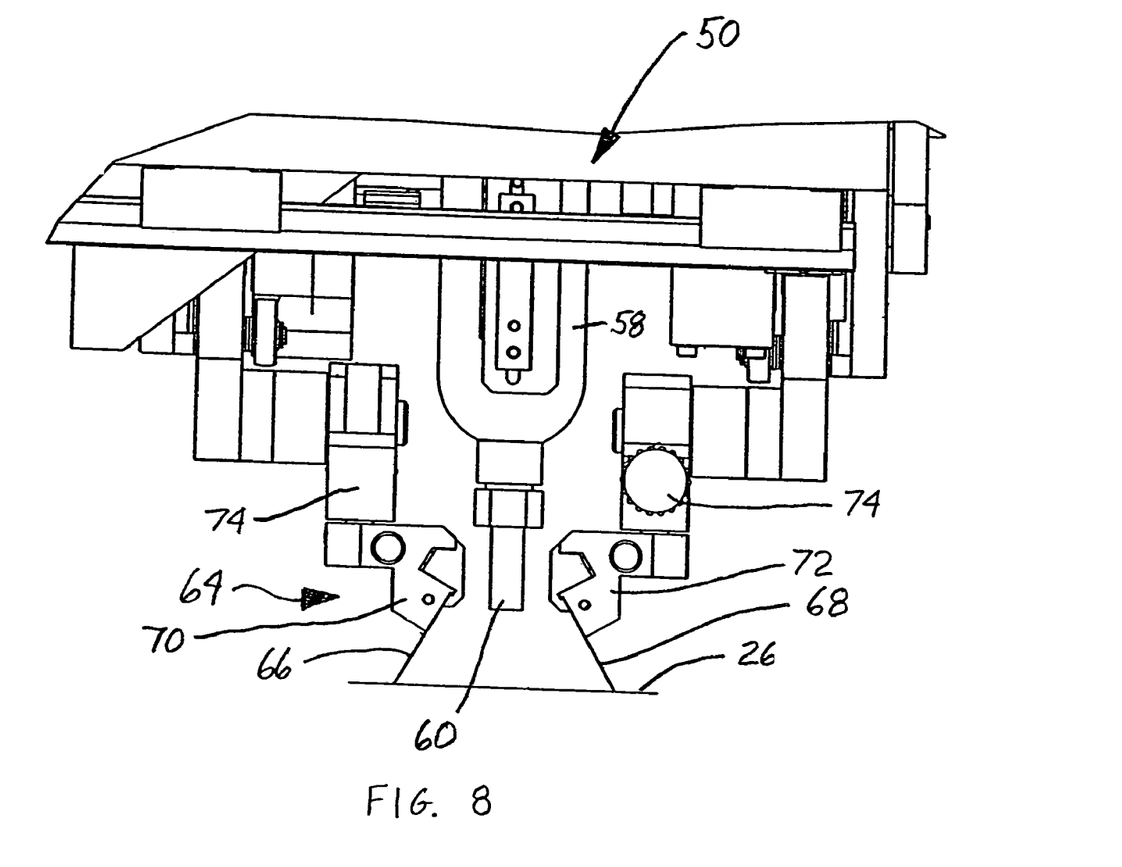
FIG. 8 is a side elevational view of the dispensing head shown in FIGS. 6 and 7.

Referring to FIG. 8, the dispensing head 28 further includes a wiper blade assembly, generally indicated at 64, for forcing solder paste into the apertures of the stencil 26 during the first and second print strokes. As shown, the wiper blade assembly 64 has left and right wiper blades 66, 68 connected to the dispensing head frame by left and right connecting members 70, 72, respectively. Referring to FIG. 6, which illustrates only one wiper blade 66, the wiper blades 66, 68, are secured to the support bracket 44 or the plate 42 by a clamping mechanism 74. The arrangement is such that the left wiper blade 66 is adapted to print solder paste when the dispensing head 28 is traveling during the first print stroke. During the first print stroke, the right wiper blade 68 is slightly raised off of the surface of the stencil 26. Upon completion of the first print stroke, the right wiper blade 68 is lowered to engage the stencil 26 while the left wiper blade 66 is slightly raised. Simultaneously, the substrate (e.g., circuit board 30) is ejected from the stencil printer 20 and a subsequent substrate is delivered to the stencil printer and positioned therein for printing. Next, the right wiper blade 68 forces solder paste into the apertures of the stencil 26 while the dispensing head 28 travels during the second print stroke.

Figure 7:
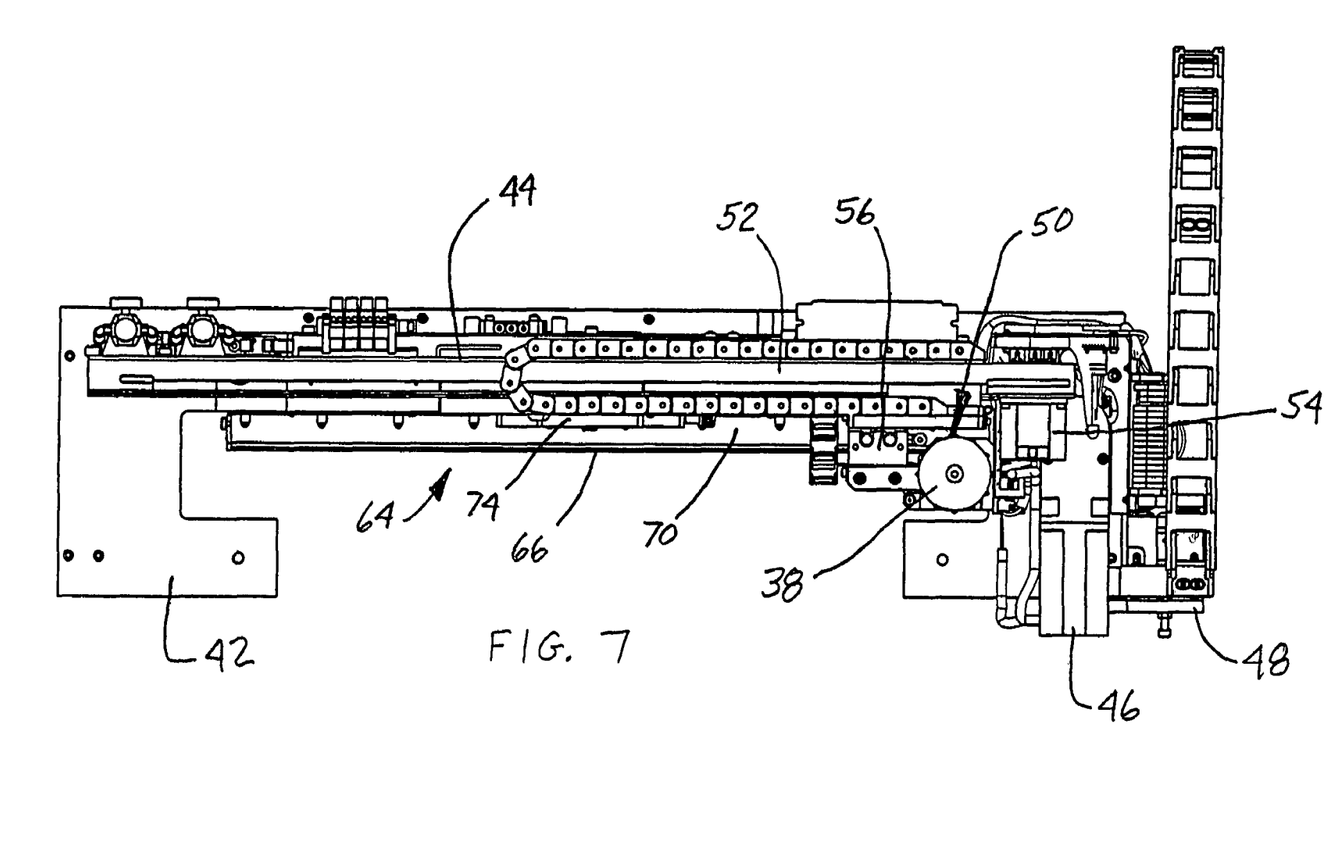
FIG. 7 is a top plan view of the dispensing head shown in FIG. 6.

During operation, the amount of solder paste dispensed between the first and second wiper blades 66, 68 is controlled by the controller 24, or, in another aspect of the invention, by the stencil printer operator. As shown in FIGS. 6-8, and more particularly in FIG. 8, the nozzle 60 of the dispensing unit 50 is disposed in between the first and second wiper blades 66, 68. Solder paste can be dispensed anywhere in a dispensing region defined by the wiper blades 66, 68 by lowering the dispensing unit by the sliding mechanism 56 and the pneumatic actuator along the Z-axis so that the nozzle 60 of the dispensing unit is disposed between the wiper blades 66, 68. Translational movement of the dispensing unit is caused by activating the motor 54 to dispense along the length of the wiper blades 66, 68.

One advantage of the present invention is that the dispensing region defined by the first and second wiper blades 66, 68 does not have to be pressurized as with the prior art dispenser disclosed in U.S. Pat. No. 5,947,022. Additionally, since the dispensing head 28 is already disposed between the first and second wiper blades 66, 68, solder paste can be dispensed on demand without having to cease operation of a printing operation or to wait between printing operations and having to move the wiper blades, move the dispensing unit and dispense solder paste. The dispensing head 28 is configured in accordance with at least one aspect of the present invention to dispense solder paste directly onto the substrate without having to move these components separately. Another aspect of the invention is that the translational movement assembly and the sliding mechanism 56 enable solder paste to be dispensed anywhere along the length of the first and second wiper blades 66, 68. Specifically, the dispensing unit 50 is capable of being lowered and capable of moving along the length of the rail 52 to deposit a bead of solder paste directly between the wiper blades 66, 68, even during a printing operation. The movement of the dispensing unit 50 is controlled by the controller 24, which energizes the motor 54 to effect the movement. In another embodiment of the invention, the stencil printer operator can manipulate the stencil printer 20 to deposit solder paste.

While this invention has been shown and described with references to particular embodiments thereof, those skilled in the art will understand that various changes in form and details may be made therein without departing from the scope of the invention, which is limited only to the following claims.

What is claimed is:

1. A stencil printer for printing solder paste onto a substrate, the stencil printer comprising:
   a frame;
   a stencil coupled to the frame, the stencil having apertures formed therein;
   a support assembly, coupled to the frame, to support the substrate in a printing position beneath the stencil; and
   a dispensing head coupled to the frame in such a manner that the dispensing head is configured to traverse the stencil during first and second print strokes, the dispensing head comprising
      a frame assembly,
      a wiper blade assembly, coupled to the frame assembly, having first and second wiper blades that contact the stencil to print solder paste onto the stencil during a print stroke, the first and second wiper blades being constructed and arranged to force solder paste through the apertures of the stencil without pressurizing the solder paste,
      a dispensing unit, coupled to the frame assembly, having a chamber adapted to dispense solder paste, the dispensing unit being disposed between the first and second wiper blades to deposit solder paste therebetween, the dispensing unit being configured to deposit solder paste on the stencil, and
      a translational movement assembly, coupled to the frame assembly and the dispensing unit, to move the dispensing unit in a direction transverse to the direction of the movement of the dispensing head during the first and second print strokes, the translational movement assembly having a sliding mechanism to move the dispensing unit toward the stencil when depositing solder paste on the stencil, wherein the dispensing head is adapted to print unpressurized solder paste on to the substrate.

2. The stencil printer of claim 1, the first wiper blade being adapted to print solder paste during the first print stroke and the second wiper blade being adapted to print solder paste during the second print stroke.

3. The stencil printer of claim 1, the dispensing unit having a housing that defines the chamber.

4. The stencil printer of claim 3, the dispensing head further comprising a removable cartridge constructed and arranged for containing solder paste.

5. The stencil printer of claim 4, the cartridge having a removable nozzle coupled to the housing to dispense solder paste from the housing and an inlet to receive pressurized air to apply pressure to the solder paste to cause the solder paste to be dispensed.

6. The stencil printer of claim 1, the translational movement assembly having a support bracket to support the dispensing unit, a rail member connected to the frame assembly, and a motor to move the dispensing unit along the rail member.

7. A method for printing solder paste onto substrate, the method comprising:
  delivering a substrate to a stencil printer;
  positioning the substrate in a print position;
  engaging a stencil having apertures to the substrate;
  performing a print stroke with one of first and second wiper blades to force solder paste through the apertures of the stencil on to the substrate without pressurizing the solder paste;
  depositing solder paste between the first and second wiper blades during the print stroke, the solder paste being unpressurized after being deposited between the first and second wiper blades, wherein the step of depositing solder paste between the first and second wiper blades further includes depositing solder paste with a dispensing unit between the first and second wiper blades along a length of the first and second wiper blades; and
  moving the dispensing unit toward the stencil when depositing solder paste on the stencil by sliding the dispensing unit on a sliding mechanism.

8. The method set forth in claim 7, further comprising:
  delivering a subsequent substrate to the stencil printer;
  positioning the subsequent substrate in a print position; and
  performing a subsequent print stroke with the other of the first and second wiper blades to print solder paste on the subsequent substrate.

9. The method of claim 7, wherein the method further comprises moving the dispensing unit in a direction transverse to the direction of movement of the dispensing unit during first and second print strokes.

10. A dispensing head for depositing solder paste on a stencil of a stencil printer, the dispensing head comprising:
  a frame assembly;
  a wiper blade assembly, coupled to the frame assembly, having first and second wiper blades that contact the stencil to print solder paste onto the stencil during a print stroke, the first and second wiper blades being constructed and arranged to force solder paste through the apertures of the stencil without pressurizing the solder paste;
  a dispensing unit, coupled to the frame assembly, having a chamber adapted to dispense solder paste, the dispensing unit being disposed between the first and second wiper blades to deposit solder paste therebetween, wherein the dispensing head is adapted to print unpressurized solder paste on to the substrate during a print stroke; and
  a translational movement assembly, coupled to the frame assembly and the dispensing unit, to move the dispensing unit in a direction along the length of the first and second wiper blades during the print stroke to deposit solder paste, the translational movement assembly having a sliding mechanism to move the dispensing unit toward the stencil when depositing solder paste on the stencil.

11. The dispensing head of claim 10, the first wiper blade being adapted to print solder paste during the first print stroke and the second wiper blade being adapted to print solder paste during the second print stroke.

12. The dispensing head of claim 10, the dispensing unit having a housing that defines the chamber.

13. The dispensing head of claim 12, the dispensing head further comprising a removable cartridge constructed and arranged for containing solder paste.

14. The dispensing head of claim 13, the cartridge having a removable nozzle coupled to the housing to dispense solder paste from the housing and an inlet to receive pressurized air to apply pressure to the solder paste to cause the solder paste to be dispensed.

15. The dispensing head of claim 10, the translational movement assembly having a support bracket to support the dispensing unit, a rail member connected to the frame assembly, and a motor to move the dispensing unit along the rail member.

* * * * *